United States Patent
Naem et al.

(10) Patent No.: US 7,964,934 B1
(45) Date of Patent: Jun. 21, 2011

(54) FUSE TARGET AND METHOD OF FORMING THE FUSE TARGET IN A COPPER PROCESS FLOW

(75) Inventors: Abdalla Aly Naem, San Jose, CA (US); Chin-Miin Shyu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 930 days.

(21) Appl. No.: 11/805,054

(22) Filed: May 22, 2007

(51) Int. Cl.
H01L 23/52 (2006.01)

(52) U.S. Cl. .................... 257/529; 257/E23.149

(58) Field of Classification Search .......... 257/202, 257/208, 209, 499, 528–530, 797, E23.141, 257/E23.142, E23.146, E23.149
See application file for complete search history.

(56) References Cited

U.S. PATENT DOCUMENTS

| | | | |
|---|---|---|---|
| 5,254,493 A | 10/1993 | Kumar | |
| 5,550,405 A | 8/1996 | Cheung et al. | |
| 5,652,459 A | 7/1997 | Chen | |
| 5,728,594 A | 3/1998 | Efland et al. | 437/40 |
| 5,891,805 A | 4/1999 | Cheng et al. | |
| 6,020,640 A | 2/2000 | Efland et al. | 257/751 |
| 6,025,275 A | 2/2000 | Efland et al. | 438/722 |
| 6,046,071 A | 4/2000 | Sawai et al. | |
| 6,090,697 A | 7/2000 | Xing et al. | |
| 6,133,133 A | 10/2000 | Givens | |
| 6,140,150 A | 10/2000 | Efland et al. | 438/106 |
| 6,140,702 A | 10/2000 | Efland et al. | 257/762 |
| 6,150,722 A | 11/2000 | Efland et al. | 257/762 |
| 6,197,688 B1 | 3/2001 | Simpson | 438/678 |
| 6,236,101 B1 | 5/2001 | Erdeljac et al. | 257/531 |
| 6,294,474 B1 | 9/2001 | Tzeng et al. | |
| 6,316,359 B1 | 11/2001 | Simpson | 438/678 |
| 6,372,586 B1 | 4/2002 | Efland et al. | 438/301 |
| 6,392,300 B1 * | 5/2002 | Koike | 257/758 |
| 6,407,453 B1 | 6/2002 | Watanabe et al. | |
| 6,521,533 B1 | 2/2003 | Morand et al. | 438/687 |
| 6,528,419 B1 | 3/2003 | Kordic et al. | 438/675 |
| 6,559,548 B1 | 5/2003 | Matsunaga et al. | |
| 6,638,792 B2 | 10/2003 | Hui et al. | 438/118 |
| 6,713,381 B2 | 3/2004 | Barr et al. | |
| 6,713,835 B1 | 3/2004 | Horak et al. | |
| 6,743,719 B1 | 6/2004 | Chen et al. | 438/658 |
| 6,750,553 B2 | 6/2004 | Abesingha et al. | 257/787 |
| 6,856,019 B2 | 2/2005 | Tamaru et al. | |
| 6,943,101 B2 | 9/2005 | Brintzinger | |
| 7,071,024 B2 | 7/2006 | Towle et al. | |
| 7,087,991 B2 | 8/2006 | Chen et al. | |
| 7,101,809 B2 | 9/2006 | Jo | 438/754 |

(Continued)

OTHER PUBLICATIONS

U.S. Appl. No. 11/805,058 to Abdalla Aly Naem filed May 22, 2007.

(Continued)

*Primary Examiner* — Ha Tran T Nguyen
*Assistant Examiner* — Kevin Quinto
(74) *Attorney, Agent, or Firm* — Mark C. Pickering (57) ABSTRACT

A fuse target is fabricated in a copper process by forming a number of copper targets at the same time that the copper traces are formed. After the copper targets and the copper traces have been formed, metal targets, such as aluminum targets, are formed on the copper targets at the same time that metal bonding pads, such as aluminum bonding pads, are formed on the copper traces.

18 Claims, 7 Drawing Sheets

U.S. PATENT DOCUMENTS

| | | |
|---|---|---|
| 7,105,917 B2 | 9/2006 | Cho et al. |
| 7,132,297 B2 | 11/2006 | Griglione et al. |
| 7,247,555 B2 | 7/2007 | Cong et al. |
| 7,262,126 B2 | 8/2007 | Bojkov et al. |
| 7,271,013 B2 | 9/2007 | Yong et al. ............ 438/14 |
| 7,323,406 B2 | 1/2008 | Lim et al. ............ 438/622 |
| 2001/0042897 A1 | 11/2001 | Yeh et al. |
| 2002/0102831 A1 | 8/2002 | Hui et al. |
| 2002/0155672 A1 | 10/2002 | Wang et al. |
| 2003/0025173 A1 | 2/2003 | Suminoe et al. |
| 2003/0076715 A1 | 4/2003 | Ikuta et al. |
| 2003/0160261 A1 | 8/2003 | Moriya |
| 2003/0173675 A1 | 9/2003 | Watanabe et al. |
| 2003/0205810 A1 | 11/2003 | Usami |
| 2004/0026786 A1 | 2/2004 | Leu et al. |
| 2004/0070042 A1 | 4/2004 | Lee et al. |
| 2005/0017355 A1 | 1/2005 | Chou et al. |
| 2005/0090071 A1* | 4/2005 | Dower et al. ............ 438/401 |
| 2005/0098903 A1 | 5/2005 | Yong et al. |
| 2005/0121788 A1 | 6/2005 | Watanabe et al. |
| 2005/0127447 A1 | 6/2005 | Jo |
| 2005/0194683 A1 | 9/2005 | Yu et al. |
| 2005/0218527 A1 | 10/2005 | Watanabe |
| 2005/0245076 A1 | 11/2005 | Bojkov et al. |
| 2006/0001170 A1 | 1/2006 | Zhang et al. |
| 2006/0012046 A1 | 1/2006 | Koura et al. |
| 2006/0157854 A1 | 7/2006 | Takewaki et al. |
| 2006/0166402 A1 | 7/2006 | Lim et al. |
| 2006/0202346 A1 | 9/2006 | Shih et al. |
| 2006/0214260 A1 | 9/2006 | Cho et al. |
| 2007/0181968 A1 | 8/2007 | Kim |
| 2007/0205520 A1 | 9/2007 | Chou et al. |
| 2008/0105947 A1 | 5/2008 | Kuzuhara et al. |

OTHER PUBLICATIONS

U.S. Appl. No. 11/805,056 to Abdalla Aly Naem filed May 22, 2007.

U.S. Appl. No. 12/283,852 to Abdalla Aly Naem et al filed Sep. 15, 2008.

U.S. Appl. No. 11/643,243, filed Dec. 21, 2006 to Shahram Mostafazadeh et al.

U.S. Appl. No. 11/592,926, filed Nov. 3, 2006 to Abdalla Aly Naem.

U.S. Appl. No. 11/592,926 to Abdalla Aly Naem filed Nov. 3, 2006.

U.S. Appl. No. 11/643,243 to Shahram Mostafazadeh et al filed Dec. 21, 2006.

U.S. Appl. No. 11/805,056, filed May 22, 2007, Naem.

U.S. Appl. No. 11/805,058, filed May 22, 2007, Naem.

U.S. Appl. No. 11/805,056 to Abdalla Aly Naem filed on May 22, 2007.

\* cited by examiner

FUSE TARGET AND METHOD OF FORMING THE FUSE TARGET IN A COPPER PROCESS FLOW

BACKGROUND OF THE INVENTION

1. Field of the Invention

The present invention relates to a fuse target and, more particularly, to a fuse target and a method of forming the fuse target in a copper process flow.

2. Description of the Related Art

A fuse is a device that provides a low-resistance current path between two conductive lines when the fuse is unprogrammed, and a high-resistance current path between the two conductive lines when the fuse is programmed. Fuses are commonly used to trim semiconductor devices, such as resistors, to form precision analog devices.

A fuse target is a device that has a unique signature which can be detected by an optical recognition system. For example, an optical recognition system can detect the shape and reflectivity of a fuse target, and then determine the position of the fuse target. The fuse target has a known positional relationship with respect to the semiconductor fuse. As a result, the position of the semiconductor fuse can be determined from the position of the fuse target.

Figure 1A:
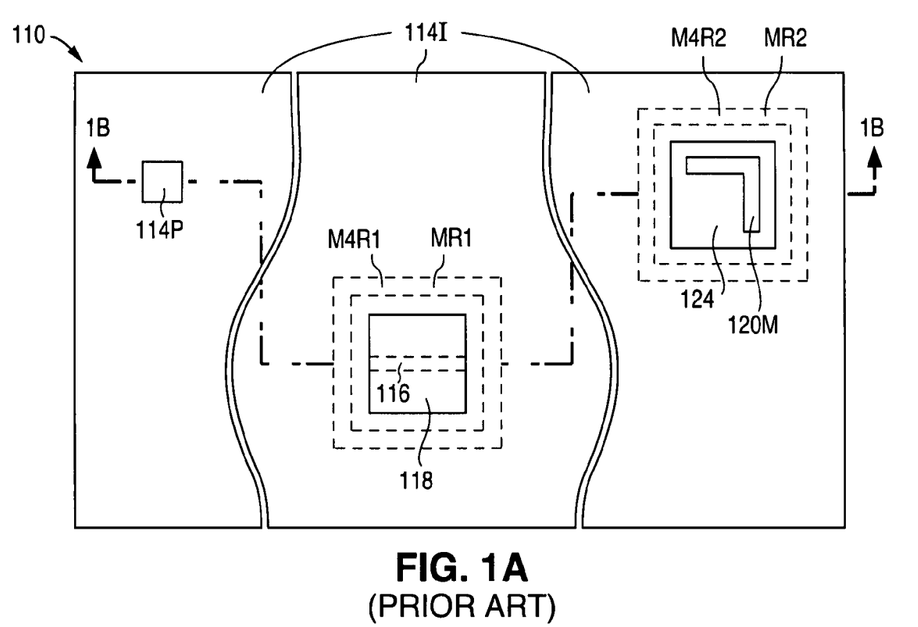
Figure 1B:
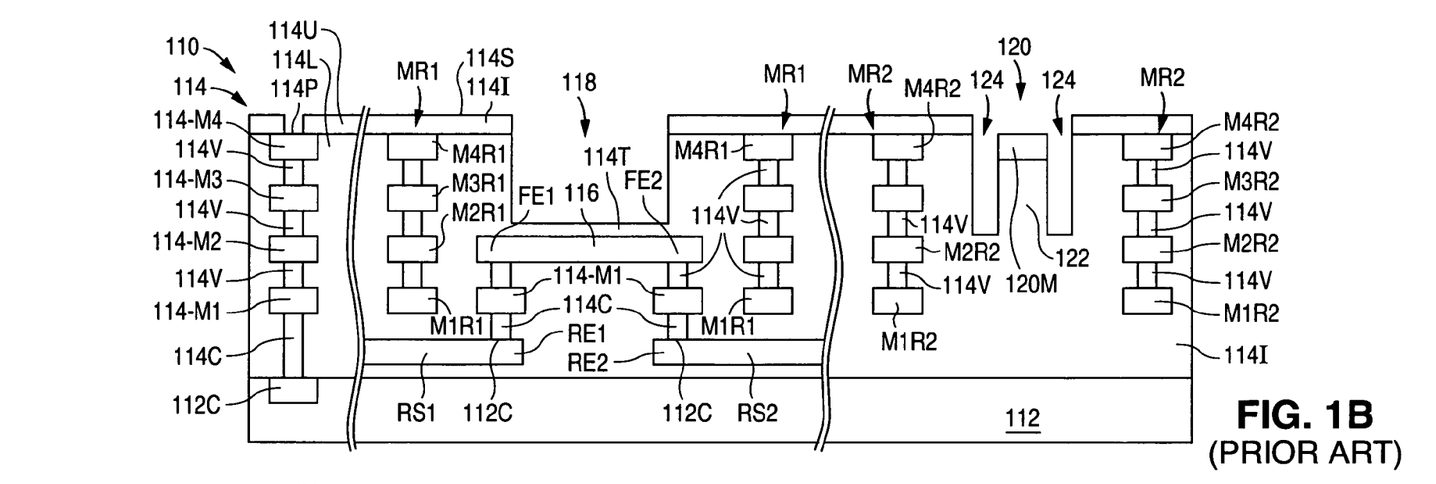
FIGS. 1B and 1C are cross-sectional views taken along line 1B-1B of FIG. 1A.
Figure 1C:
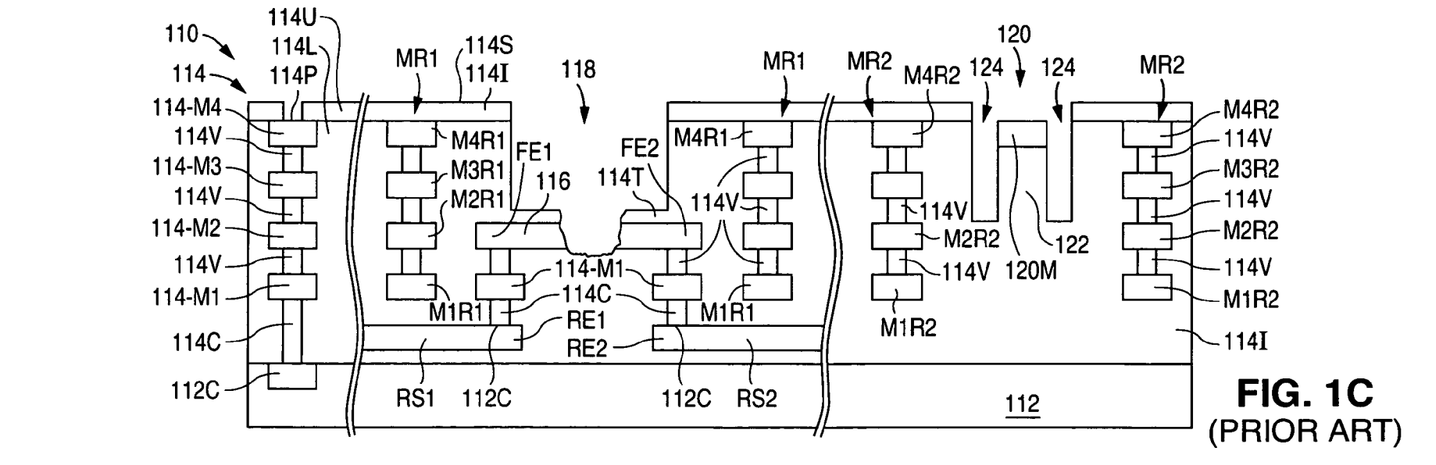

FIGS. 1A-1C show views that illustrate a prior-art semiconductor wafer 110 with a fuse and a fuse target. FIG. 1A shows a plan view, while FIGS. 1B and 1C show cross-sectional views taken along line 1B-1B of FIG. 1A. As shown in FIGS. 1A-1C, semiconductor wafer 110 includes a semiconductor substrate 112 and a metal interconnect structure 114 that is connected to semiconductor substrate 112.

Semiconductor substrate 112 includes a number of structures that are formed in and on substrate 112. The structures, which include resistors, transistors, capacitors, diodes, and similar devices, have a number of conductive contact regions 112C, such as the ends of a resistor and the terminals of a transistor. In the present example, the resistors include a trim resistor that has a first polysilicon resistive segment RS1 with a conductive contact region 112C at an end RE1, and a second polysilicon resistive segment RS2 with a conductive contact region 112C at an end RE2.

Metal interconnect structure 114, in turn, is a multi-layered structure that electrically interconnects together the various devices that are formed on substrate 112 to realize an electrical circuit. Metal interconnect structure 114 includes a number of contacts 114C that touch the conductive contact regions 112C (either directly or via silicide).

Metal interconnect structure 114 also includes a number of metal-1 traces 114-M1 that are connected to the contacts 114C, a number of metal-2 traces 114-M2, a number of metal-3 traces 114-M3, and a number of metal-4 traces 114-M4. In the present example, the metal-1 traces 114-M1, the metal-2 traces 114-M2, the metal-3 traces 114-M3, and the metal-4 traces 114-M4 are implemented with aluminum. Further, selected regions on the top surfaces of the metal-4 traces 114-M4 are exposed to the external world, and function as bond pads 114P that provide an external electrical connection point.

In addition, metal interconnect structure 114 includes a number of inter-metal vias 114V that connect the metal-1 traces 114-M1 and the metal-2 114-M2 traces together, the metal-2 traces 114-M2 and the metal-3 114-M3 traces together, and the metal-3 traces 114-M3 and the metal-4 114-M4 traces together.

Metal interconnect structure 114 further includes a planarized insulation region 114I that touches semiconductor substrate 112, the conductive contacts 114C, the metal-1 traces 114-M1, the metal-2 traces 114-M2, the metal-3 traces 114-M3, the metal-4 traces 114-M4, and the inter-metal vias 114V. In the present example, insulation region 114I includes a region of oxide 114L and an overlying passivation layer 114U. Passivation layer 114U, which has a top surface 114S, can be implemented with, for example, oxide, nitride, or a combination of oxide and nitride.

Metal interconnect structure 114 further includes a fuse 116 which has a first end FE1 and a second end FE2. First end FE1 makes an electrical connection with the structure to be trimmed which, in the present example, is end RE1 of polysilicon resistive segment RS1 of the trim resistor. Similarly, second end FE2 makes an electrical connection with the structure to be trimmed which, in the present example, is end RE2 of polysilicon resistive segment RS2 of the trim resistor. Fuse 116 is illustrated in the present example as a short thin metal-2 trace, although fuse 116 can be implemented in other metal layers.

In addition, metal interconnect structure 114 includes a stacked metal ring structure MR1 that is formed around fuse 116 to protect adjacent regions of wafer 110 from fuse 116 during programming. Metal ring structure MR1 includes a metal-1 trace 114-M1 that is formed around fuse 116 as a metal-1 ring M1R1, and a metal-2 trace 114-M2 that is formed around fuse 116 as a metal-2 ring M2R1. Further, metal ring structure MR1 includes a metal-3 trace 114-M3 that is formed around fuse 116 as a metal-3 ring M3R1, and a metal-4 trace 114-M4 that is formed around fuse 116 as a metal-4 ring M4R1.

The metal rings M1R1, M2R1, M3R1, and M4R1 are electrically connected together by way of a number of inter-metal vias 114V, but are electrically isolated from all other conducting structures. (Only one fuse 116 is shown for clarity. A large number of fuses 116 can lie within stacked metal ring MR1 (a bank of fuses), and wafer 110 can include a large number of fuse banks.) Metal interconnect structure 114 also includes a fuse opening 118 in planarized insulation region 114I that exposes a thin layer 114T of planarized insulation region 114I that lies on fuse 116.

In addition, metal interconnect structure 114 includes a fuse target 120 that has a known positional relationship with fuse 116. (Only one fuse target 120 is shown for clarity. Fuse targets are commonly located in the corners of a region that surround the fuse banks.) In the present example, fuse target 120 is illustrated as an exposed, electrically-isolated, L-shaped metal-4 trace 120M that sits on a pedestal 122 surrounded by a trench 124.

Metal interconnect structure 114 further includes a stacked metal ring structure MR2 that is formed around fuse target 120 to protect adjacent regions of wafer 110 from fuse target 120 during the formation of fuse opening 118 and trench 124. Metal ring structure MR2 includes a metal-1 trace 114-M1 that is formed around fuse target 120 as a metal-1 ring M1R2, and a metal-2 trace 114-M2 that is formed around fuse target 120 as a metal-2 ring M2R2.

Metal ring structure MR2 also includes a metal-3 trace 114-M3 that is formed around fuse target 120 as a metal-3 ring M3R2, and a metal-4 trace 114-M4 that is formed around fuse target 120 as a metal-4 ring M4R2. The metal rings M1R2, M2R2, M3R2, and M4R2 are electrically connected together by way of a number of inter-metal vias 114V, but are electrically isolated from all other conducting structures.

In operation, in the native or unprogrammed state, which is shown in FIG. 1B, fuse 116 provides a low-resistance current path between the resistive segments RS1 and RS2. To program fuse 116, an optical recognition system is used to detect the shape and reflectivity of fuse target 120, and then determine the position of fuse target 120. Once fuse target 120 has been located, the position of fuse 116 is determined from the known positional relationship.

After the position of fuse 116 has been determined, a laser beam with a predefined output power is directed to that position. Fuse 116 is heated by the laser until a portion thin insulation region 114T and a portion of fuse 116 evaporate away to leave two physically separated sections of fuse 116. The two physically separated sections of fuse 116, in turn, provide an open current path between the polysilicon resistive segment RS1 and RS2. FIG. 1C shows semiconductor wafer 110 after fuse 116 has been programmed.

One problem with fuse target 120 is that fuse target 120 is not compatible with the current-generation processes that are used to form copper-topped interconnect structures. To reduce the resistance of a metal interconnect structure, current-generation processes commonly form the top one or more layers of metal traces from copper.

Figure 2A:
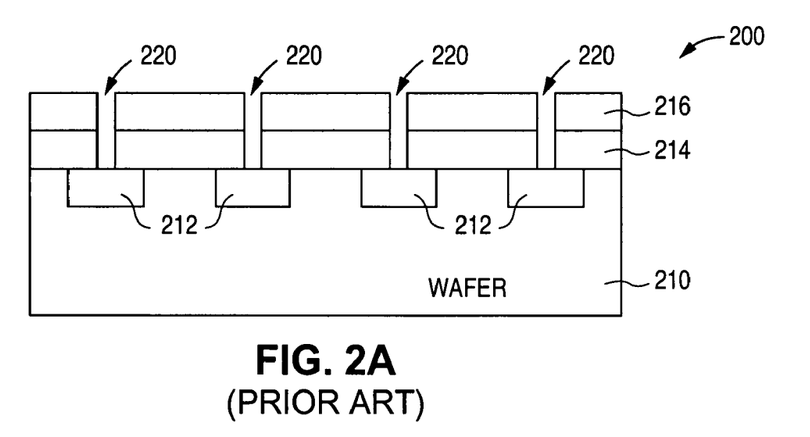
FIGS. 2A-2F are a series of cross-sectional views illustrating a prior-art method 200 of forming copper traces that lie over a top layer of aluminum traces.

FIGS. 2A-2F show a series of cross-sectional views that illustrate a prior-art method 200 of forming copper traces that lie over a top layer of aluminum traces. As shown in FIG. 2A, method 200 is practiced on a conventionally-formed semiconductor wafer 210 that includes an interconnect structure which has a top layer of aluminum traces 212.

As further shown in FIG. 2A, the method begins by depositing a layer of passivation (non-conductive) material 214, such as a layer of nitride, oxide, or a combination of oxide and nitride, over the top surfaces of the aluminum traces 212. The method continues by forming and patterning a mask 216 on passivation layer 214. Following this, the exposed regions of passivation layer 214 are etched to form openings 220 that expose the top surfaces of the aluminum traces 212 of the interconnect structure. Mask 216 is then removed.

Figure 2B:
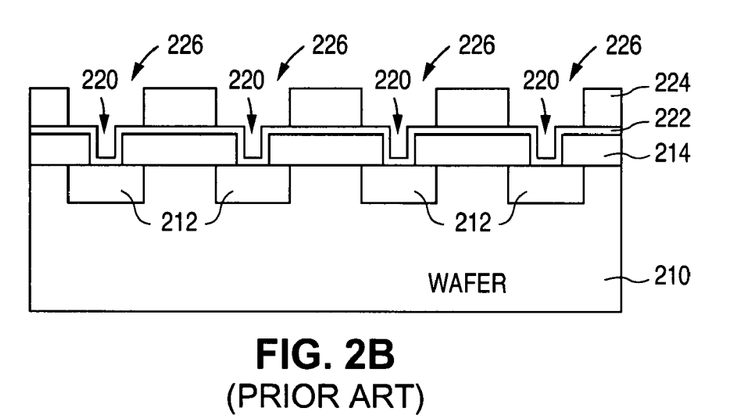

As shown in FIG. 2B, after mask 216 has been removed, a seed layer 222 is formed on passivation layer 214 and the exposed regions of the aluminum traces 212. Seed layer 222 typically includes a layer of titanium (e.g., 300 Å thick) and an overlying layer of copper (e.g., 3000 Å thick). The titanium layer enhances the adhesion between the underlying aluminum traces 212 and the overlying layer of copper. Next, a mask 224 is formed and patterned on seed layer 222 to have a number of openings 226 that expose the number of openings 220.

Figure 2C:
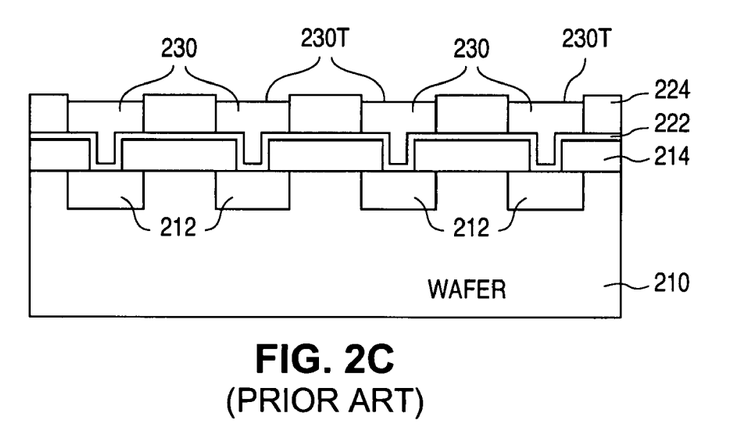

As shown in FIG. 2C, following the formation and patterning of mask 224, copper is electroplated to form a number of copper traces 230 that touch the top surfaces of the aluminum traces 212. Each of the copper traces 230 has a top surface 230T. After the copper traces 230 have been formed, mask 224 is removed, followed by the removal of the underlying regions of seed layer 222.

Figure 2D:
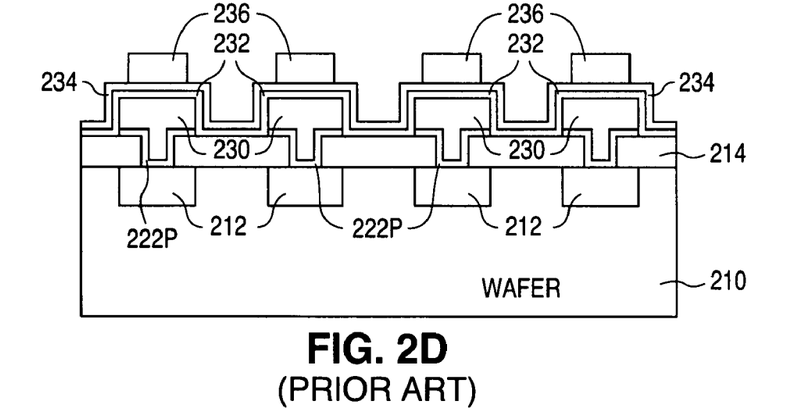

As shown in FIG. 2D, the removal of seed layer 222 from the top surface of passivation layer 214 forms a number of spaced-apart seed portions 222P. The seed portions 222P touch the aluminum metal-4 trace 114-M4, passivation layer 214, and the copper traces 230. After mask 224 and the underlying regions of seed layer 222 have been removed, an adhesion enhancing layer 232, such as titanium, is deposited on the exposed regions of passivation layer 214 and the copper traces 230. Following this, a metallic layer 234, such as aluminum, aluminum-copper, or gold, is deposited on adhesion enhancing layer 232. Once metallic layer 234 has been formed, a mask 236 is formed and patterned on metallic layer 234.

Figure 2E:
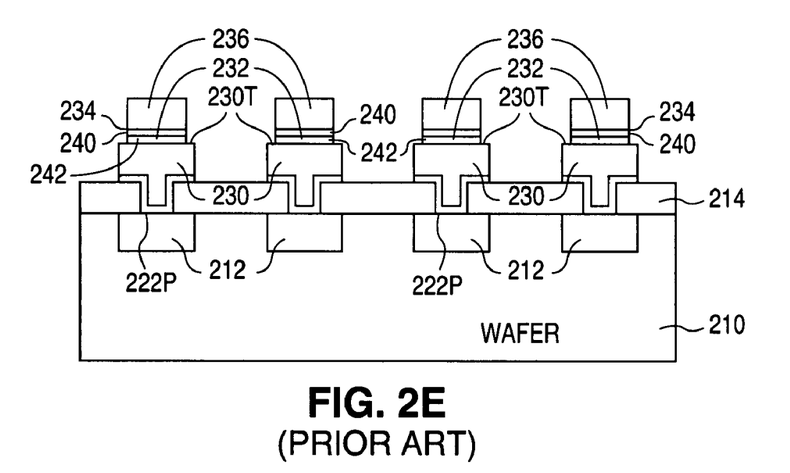

As shown in FIG. 2E, after mask 236 has been formed and patterned, the exposed regions of metallic layer 234 are etched away to form a number of spaced-apart metal bond pads 240 that lie over selected regions of the top surfaces 230T of the copper traces 230 to form external electrical connection points.

In addition to removing the exposed regions of metallic layer 234, as further shown in FIG. 2E, the underlying regions of adhesion enhancing layer 232 are also etched away to form a number of spaced-apart adhesion enhancing pads 242 that lie between and touch the copper traces 230 and the metal bond pads 240.

Figure 2F:
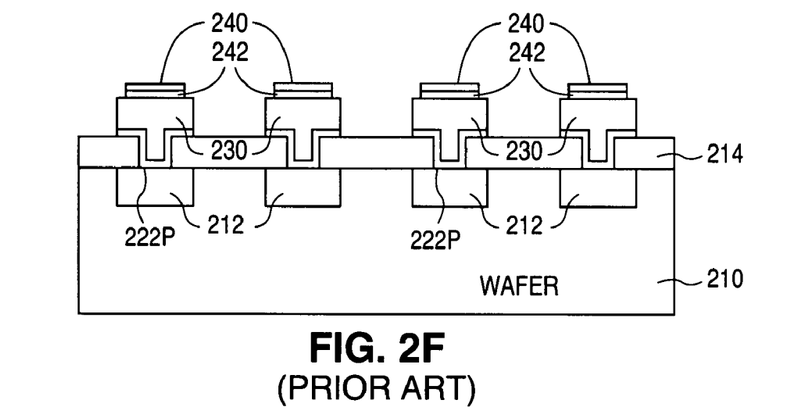

Once the etch has been completed, as shown in FIG. 2F, mask 236 is removed to complete method 200. Alternately, after mask 236 has been removed, solder balls or solder bumps can be attached to the metal bond pads 240, or thin bonding wires can be bonded to the metal bond pads 240.

The problem with method 200 is that when method 200 is applied to a semiconductor wafer that includes an aluminum fuse and an aluminum fuse target, the chemistry used to remove the un-used regions of seed layer 222 also attacks the exposed aluminum of the fuse target. As a result, following the formation of a layer of copper traces, the exposed aluminum of the fuse target, such as fuse target 120, can be damaged to the point of where the optical recognition system can no longer detect the fuse target. When this occurs, the position of the fuse can no longer be identified, and the fuse can no longer be programmed.

As a result, there is a need for a fuse target that is compatible with the current-generation fabrication processes that are used to form copper-topped interconnect structures.

BRIEF DESCRIPTION OF THE DRAWINGS

FIGS. 1A-1C are views illustrating a prior-art semiconductor wafer 110 with a fuse and a fuse target. FIG. 1A is a plan view, while

DETAILED DESCRIPTION OF THE INVENTION

Figure 3A:
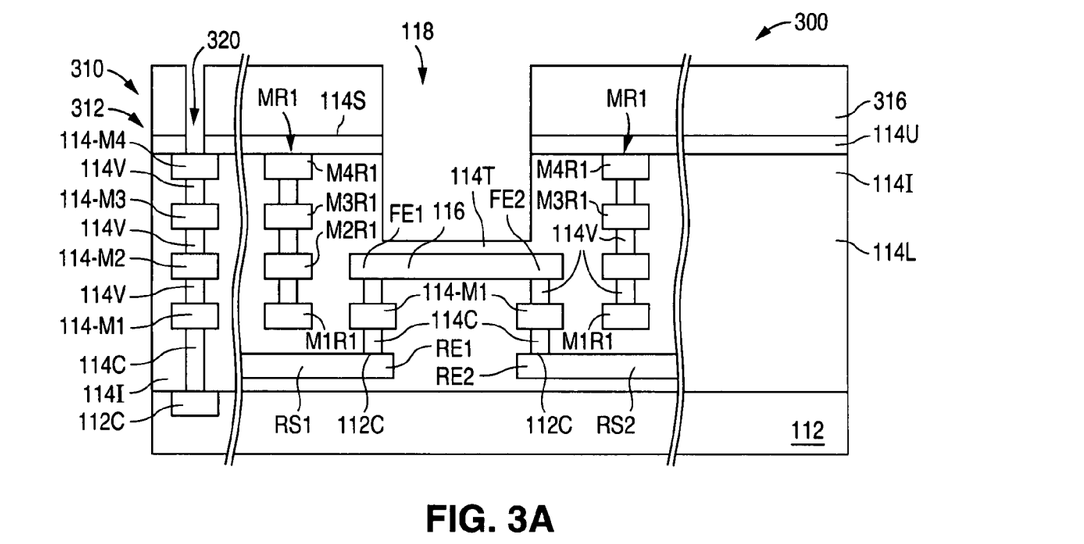
FIGS. 3A-3F are a series of cross-sectional views illustrating a method 300 of forming a fuse target in accordance with the present invention.

FIGS. 3A-3F show a series of cross-sectional views that illustrate a method 300 of forming a fuse target in accordance with the present invention. As shown in FIG. 3A, method 300 utilizes a conventionally-formed semiconductor wafer 310. In the present example, semiconductor wafer 310 is identical to semiconductor wafer 110 except that semiconductor wafer 310 utilizes a metal interconnect structure 312 in lieu of metal interconnect structure 114.

Metal interconnect structure 312, in turn, is identical to metal interconnect structure 114 except that metal interconnect structure 312 utilizes a to-be-described copper-based fuse target in lieu of fuse target 120. As a result, the reference numerals of semiconductor wafer 310 that match the reference numerals of semiconductor wafer 110 identify the same structures as the reference numerals of semiconductor wafer 110.

As shown in FIG. 3A, method 300 begins by forming and patterning a mask 316 on the top surface 114S of passivation layer 114U. Following this, the exposed regions of passivation layer 114U are etched to form a number of passivation openings 320 that expose the top surfaces of the aluminum metal-4 traces 114-M4. (Only one passivation opening 320 is shown for clarity.) The etch also forms opening 118. Mask 316 is then removed.

Figure 3B:
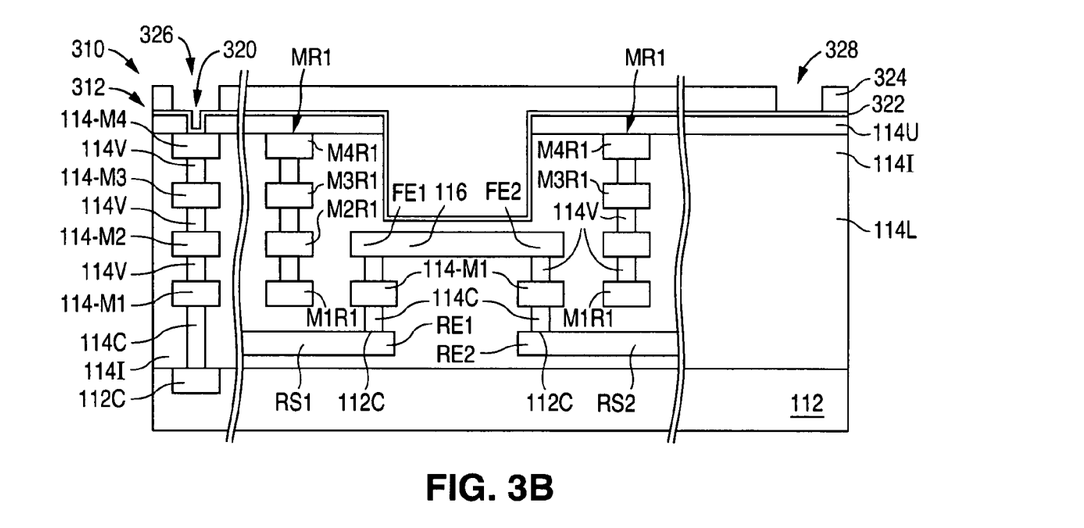

As shown in FIG. 3B, after mask 316 has been removed, a seed layer 322 is formed on insulation region 1141, and the exposed regions of the aluminum metal-4 traces 114-M4. Seed layer 322 typically includes a layer of titanium (e.g., 300 Å thick) and an overlying layer of copper (e.g., 3000 Å thick). The titanium layer enhances the adhesion between the underlying aluminum trace 114-M4 and the overlying layer of copper.

After seed layer 322 has been formed, a mask 324 is formed and patterned on seed layer 322 to have a number of conducting openings 326 that expose the number of passivation openings 320, and to also have a number of target openings 328, e.g., one in each corner of a region that surrounds the fuse banks.

Figure 3C:
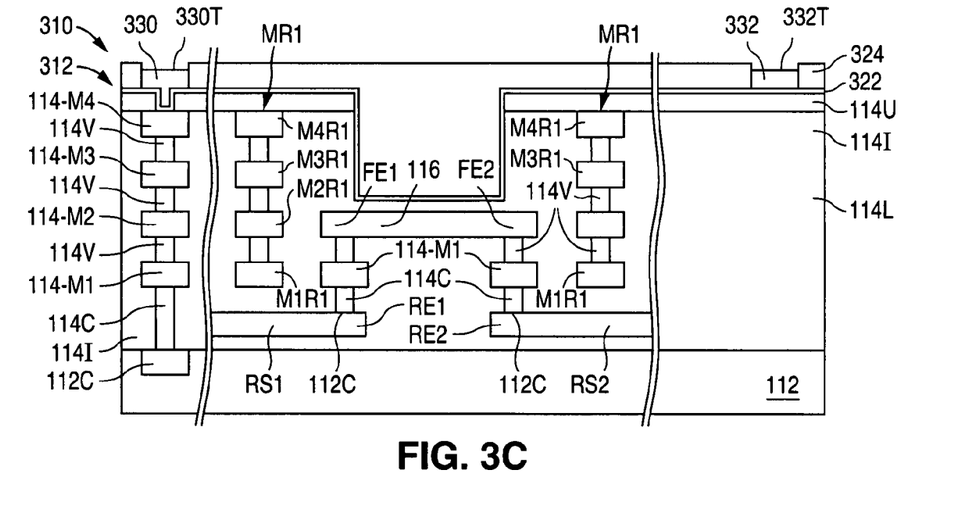

As shown in FIG. 3C, following the formation and patterning of mask 324, copper is electroplated to form a number of copper traces 330 in the openings 320 and 326, and a number of electrically-isolated copper targets 332 in the openings 328. As a result, the copper traces 330 are electrically connected to the top surfaces of the aluminum metal-4 traces 114-M4 by way of seed layer 322. Further, each of the copper traces 330 has a top surface 330T, and each of the copper targets 332 has a top surface 332T. (Only one copper trace 330 and one copper target 332 are shown for clarity.) After the copper traces 330 and copper targets 332 have been formed, mask 324 is removed, followed by the removal of the underlying regions of seed layer 322.

Figure 3D:
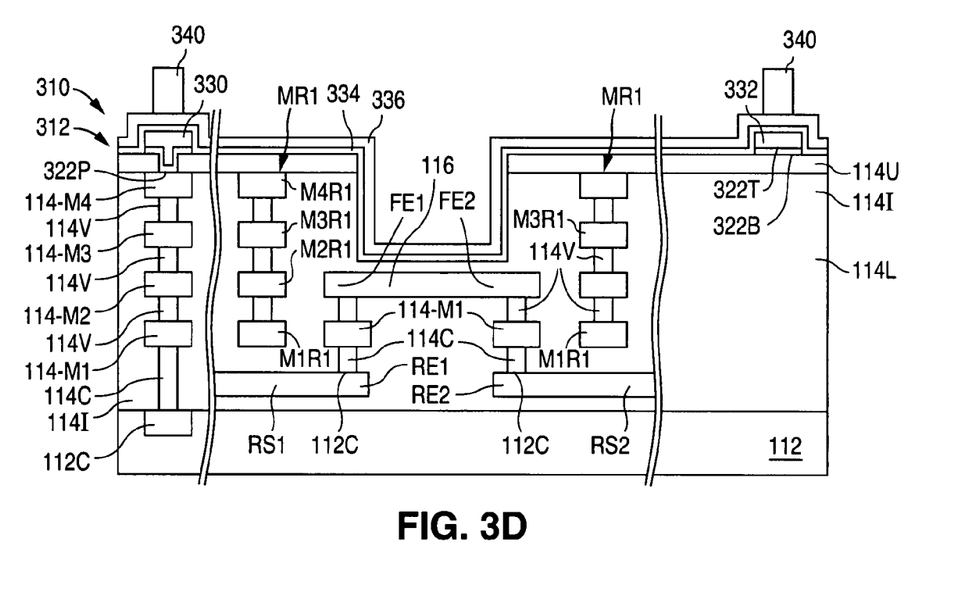

As shown in FIG. 3D, the removal of seed layer 322 from the top surface of passivation layer 114U forms a number of spaced-apart seed portions 322P and a number of spaced-apart seed targets 322T. (Only one seed portion 322P and one seed target 322T are shown for clarity.) The seed portions 322P touch the aluminum metal-4 trace 114-M4, passivation layer 114U, and the copper traces 330. The seed targets 322T, which each has a bottom surface 322B, touch passivation layer 114U and the copper targets 332.

After mask 324 and the underlying regions of seed layer 322 have been removed, an adhesion enhancing layer 334, such as titanium, is deposited on the exposed regions of passivation layer 114U, the copper traces 330, and the copper targets 332. Following this, a metallic layer 336, such as aluminum, aluminum-copper, or gold, is deposited on adhesion enhancing layer 334. When metallic layer 336 is formed with aluminum-copper, metallic layer 336 has more than 50% aluminum, such as aluminum with 0.5% copper. Once metallic layer 336 has been formed, a mask 340 is formed and patterned on metallic layer 336.

Figure 3E:
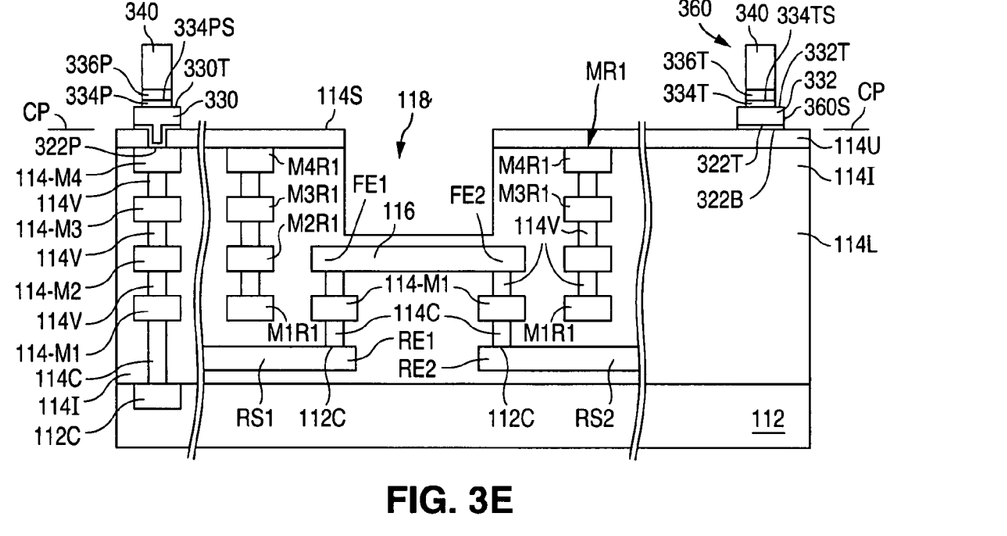

As shown in FIG. 3E, after mask 340 has been formed and patterned, the exposed regions of metallic layer 336 are etched away to form a number of metal bond pads 336P that lie over, and are electrically connected to, the top surfaces 330T of the copper traces 330, and a number of metal targets 336T that lie over, and are electrically connected to, the top surfaces 332T of the copper targets 332.

In addition to removing the exposed regions of metallic layer 336, as further shown in FIG. 3E, the underlying regions of adhesion enhancing layer 334 are also etched away to form a number of spaced-apart adhesion enhancing pads 334P that lie between and touch the copper traces 330 and the metal bond pads 336P, and a number of adhesion enhancing targets 334T that lie between and touch the copper targets 332 and the metal targets 336T. (Only one adhesion enhancing pad 334P and one adhesion enhancing target 334T are shown for clarity.) The adhesion enhancing pads 334P each has a top surface 334PS, and the adhesion enhancing targets 334T each has a top surface 334TS. In the present example, all or substantially all of the bottom surfaces 322B of the seed targets 322T and the top surface 114S of passivation layer 114U lie in a single common plane CP.

In the present example, a seed target 322T, a copper target 332 that lies over and touches the seed target 322T, an adhesion enhancing target 334T that lies over and touches the copper target 332, and a metal target 336T that lies over and touches the adhesion enhancing target 334T form a fuse target 360 that is electrically isolated from all other conducting regions. As shown in FIG. 3E, fuse target 360 has a side wall 360S which is exposed.

Figure 3F:
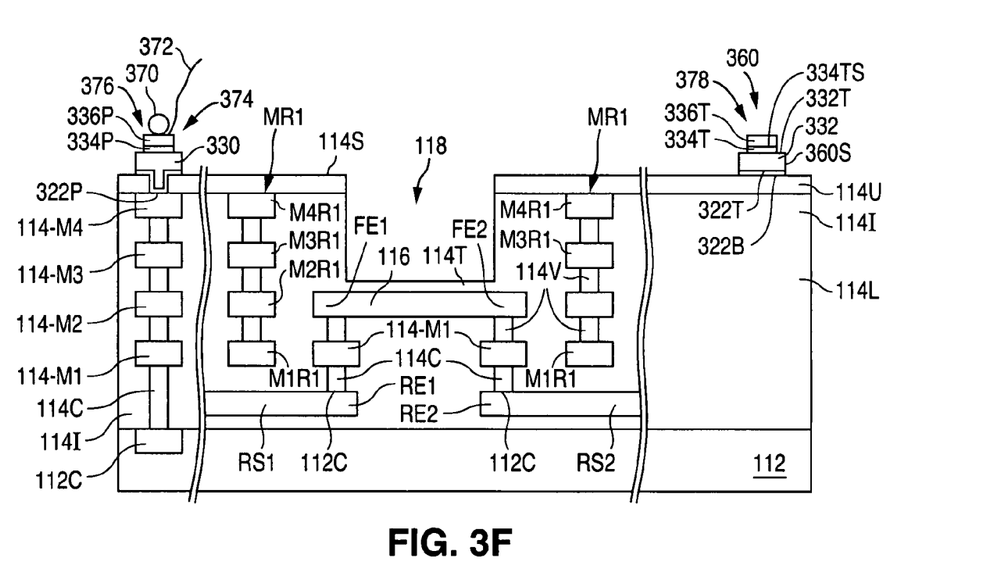

As shown in FIG. 3F, mask 340 is then removed to complete method 300 of the present invention. Alternately, after mask 340 has been removed, solder balls 370 can be attached to the metal bond pads 336P as illustrated in FIG. 3F or, thin wires 372 can be bonded to the metal bond pads 336P as alternately illustrated in FIG. 3F.

Figure 4:
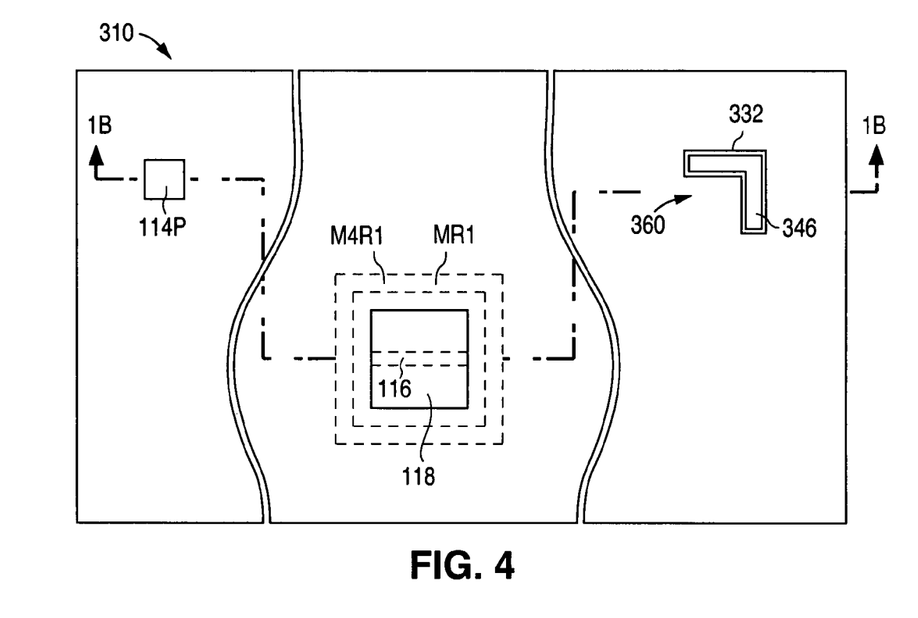
FIG. 4 is a plan view illustrating wafer 310 following the removal of mask 340 in accordance with the present invention.

FIG. 4 shows a plan view that illustrates wafer 310 following the removal of mask 340 in accordance with the present invention. As shown in FIGS. 1A and 4, the view of fuse target 120 and the view of fuse target 360 are substantially identical as seen from the perspective of the optical recognition system. (Fuse target 120 sits in an opening, whereas fuse target 360 sits on a flat surface.) As a result, fuse 116 in wafer 310 is programmed in the same manner as fuse 116 in wafer 110. (The optical recognition system may need to be compensated to accommodate any changes in the vertical separation distance between the fuse target and the optical recognition system.)

Thus, a method of forming a fuse target in a copper fabrication process has been described. As shown in FIG. 3A, semiconductor wafer 310 has an isolation structure 1141 that has a number of passivation openings 320 that expose the aluminum traces 114-M4. As shown in FIG. 3F, wafer 310 also has a number of connection structures 374 that lie in the passivation openings 320 and touch the isolation structure 1141 and the aluminum traces 114-M4.

In the present example, as shown in FIG. 3F, each connection structure 374 has a seed portion 322P, a copper trace 330 that touches the seed portion 322P, and a conductive pad 376 that touches the copper trace 330. In the present example, the conductive pad 376 includes an adhesion enhancing pad 334P that touches the copper trace 330, and a metal pad 336P that touches the adhesion enhancing pad 334P.

Further, each fuse target 360 has a seed target 322T, a copper target 332 that touches the seed target 322T, and a conductive target 378 that touches the copper target 322. In the present example, the conductive target 378 includes an adhesion enhancing target 334T that touches the copper target 332, and a metal target 336T that touches the adhesion enhancing target 334T.

In addition to forming a fuse target in a copper fabrication process, another advantage of the present invention is that the present invention eliminates the need for stacked metal ring structure MR2 shown in FIGS. 1A-1C because fuse target 360 lies above passivation layer 114U. As noted above, stacked metal ring structure MR2 is formed around fuse target 120 shown in FIGS. 1A-1C to protect adjacent regions of wafer 110 from the etch that forms fuse trench 124. In the present invention, passivation layer 114U functions as an etch stop that prevents a fuse trench like fuse trench 124 from being formed. As a result, there is no need for stacked metal ring structure MR2. The elimination of stacked metal ring structure MR2, in turn, increases the space available for other metal interconnect structures.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor wafer comprising:
a conductive region;
an isolation structure that has a top surface and an isolation opening that exposes the conductive region;
a connection structure that lies in the isolation opening and touches the isolation structure and the conductive region, the connection structure including a seed portion that touches the conductive region, a copper trace that touches the seed portion, and a non-copper conductive pad that touches the copper trace; and
a fuse target that touches the top surface of the isolation structure, the fuse target being electrically isolated from all other conducting regions, the fuse target including a seed target, a copper target that touches the seed target, and a non-copper conductive target that touches the copper target.

2. The semiconductor wafer of claim 1 wherein:
the non-copper conductive pad includes an adhesion enhancing pad that touches the copper trace, and a non-copper metal pad that touches the adhesion enhancing pad; and
the non-copper conductive target includes an adhesion enhancing target that touches the copper target, and a non-copper metal target that touches the adhesion enhancing target.

3. The semiconductor wafer of claim 1 and further comprising a solder ball attached to the non-copper conductive pad.

4. The semiconductor wafer of claim 1 and further comprising a wire bonded to the non-copper conductive pad.

5. The semiconductor wafer of claim 1 and further comprising:
an insulation region having a top surface, the isolation structure touching the top surface of the insulation region; and
a fuse that touches the insulation region.

6. A semiconductor wafer comprising:
a conductive region;
an isolation structure that has a top surface and an isolation opening that exposes the conductive region;
a connection structure that lies in the isolation opening and touches the isolation structure and the conductive region, the connection structure including a seed portion that touches the conductive region, a copper trace that touches the seed portion, and a conductive pad that touches the copper trace, the conductive pad including aluminum; and
a fuse target that touches the top surface of the isolation structure, the fuse target being electrically isolated from all other conducting regions, the fuse target including a seed target, a copper target that touches the seed target, and a conductive target that touches the copper target, the conductive target including aluminum.

7. The semiconductor wafer of claim 6 wherein:
the conductive pad includes an adhesion enhancing pad that touches the copper trace, and a metal pad that touches the adhesion enhancing pad, the metal pad including aluminum; and
the conductive target includes an adhesion enhancing target that touches the copper target, and a metal target that touches the adhesion enhancing target, the metal target including aluminum.

8. The semiconductor wafer of claim 6 and further comprising a solder ball attached to the conductive pad.

9. The semiconductor wafer of claim 6 and further comprising a wire bonded to the conductive pad.

10. The semiconductor wafer of claim 6 and further comprising:
an insulation region having a top surface, the isolation structure touching the top surface of the insulation region; and
a fuse that touches the insulation region.

11. A semiconductor structure comprising:
a first metallic structure having a top surface;
a first non-conductive structure having a top surface, and touching the first metallic structure;
a second non-conductive structure having a top surface and a bottom surface, the bottom surface of the second non-conductive structure touching the top surface of the first metallic structure and the top surface of the first non-conductive structure, no surface of the second non-conductive structure lying above the top surface of the second non-conductive structure, no surface of the second non-conductive structure lying below the bottom surface of the second non-conductive structure;
a second metallic structure touching the second non-conductive structure and the top surface of the first metallic structure;
a third metallic structure having an exposed side wall, touching and lying above the top surface of the second non-conductive structure, and being electrically isolated from all other conductive structures; and
an opening extending completely through the second non-conductive structure, the opening exposing no conductive structure.

12. The semiconductor structure of claim 11 wherein the first metallic structure has a side wall and the first non-conductive structure touches the side wall of the first metallic structure.

13. The semiconductor structure of claim 11 wherein the first non-conductive structure and the second non-conductive structure are formed from different materials.

14. The semiconductor wafer of claim 11 wherein the second metallic structure has an exposed side wall.

15. A semiconductor structure comprising:
a first metallic structure having a top surface;
a first non-conductive structure having a top surface, and touching the first metallic structure;
a second non-conductive structure having a top surface and a bottom surface, the bottom surface of the second non-conductive structure touching the top surface of the first metallic structure and the top surface of the first non-conductive structure, no surface of the second non-conductive structure lying above the top surface of the second non-conductive structure, no surface of the second non-conductive structure lying below the bottom surface of the second non-conductive structure;
a second metallic structure touching the second non-conductive structure and the top surface of the first metallic structure, the second metallic structure includes including a seed portion that touches the first metallic structure, a copper trace that touches the seed portion, and a non-copper conductive pad that touches the copper trace; and a third metallic structure having an exposed side wall, touching and lying above the top surface of the second non-conductive structure, and being electrically isolated from all other conductive structures, the third metallic structure includes including a seed target that touches the second non-conductive structure, a copper target that touches the seed target, and a non-copper conductive target that touches the copper target.

16. The semiconductor wafer of claim 15 and further comprising a bonding wire connected to the non-copper conductive pad.

17. A semiconductor structure comprising:

a first metallic structure having a top surface;

a first non-conductive structure having a top surface, and touching the first metallic structure;

a second non-conductive structure having a top surface and a bottom surface, the bottom surface of the second non-conductive structure touching the top surface of the first metallic structure and the top surface of the first non-conductive structure, no surface of the second non-conductive structure lying above the top surface of the second non-conductive structure, no surface of the second non-conductive structure lying below the bottom surface of the second non-conductive structure;

a second metallic structure touching the second non-conductive structure and the top surface of the first metallic structure, the second metallic structure including a seed portion that touches the first metallic structure, a copper trace that touches the seed portion, and a conductive pad that touches the copper trace, the conductive pad including aluminum; and a third metallic structure having an exposed side wall, touching and lying above the top surface of the second non-conductive structure, and being electrically isolated from all other conductive structures, the third metallic structure includes including a seed target that touches the second non-conductive structure, a copper target that touches the seed target, and a conductive target that touches the copper target, the conductive target including aluminum.

18. The semiconductor wafer of claim 17 and further comprising a bonding wire connected to the conductive pad.

* * * * *

UNITED STATES PATENT AND TRADEMARK OFFICE
CERTIFICATE OF CORRECTION

PATENT NO. : 7,964,934 B1  
APPLICATION NO. : 11/805054  
DATED : June 21, 2011  
INVENTOR(S) : Abdalla Aly Naem et al.

It is certified that error appears in the above-identified patent and that said Letters Patent is hereby corrected as shown below:

Column 1, line 67, delete "region 1141 that" and replace with --region 114I that--.

Column 2, line 4, delete "region 1141 includes" and replace with --region 114I includes--.

Column 2, line 39, delete "1141 that exposes" and replace with --114I that exposes--.

Column 2, line 40, delete "region 1141 that" and replace with --region 114I that--.

Column 5, line 6, delete "region 1141, and" and replace with --region 114I, and--.

Column 6, line 37, delete "structure 1141 that" and replace with --structure 114I that--.

Column 6, line 42, delete "1141 and the" and replace with --114I and the--.

Claim 15, lines 16-17, delete "structure includes including a seed" and replace with --structure including a seed--.

Claim 15, line 25, delete "structure includes including a seed" and replace with --structure including a seed--.

Claim 17, line 25, delete "structure includes including a seed" and replace with --structure including a seed--.

Signed and Sealed this  
Twenty-seventh Day of September, 2011

David J. Kappos  
*Director of the United States Patent and Trademark Office*

UNITED STATES PATENT AND TRADEMARK OFFICE
CERTIFICATE OF CORRECTION

PATENT NO. : 7,964,934 B1
APPLICATION NO. : 11/805054
DATED : June 21, 2011
INVENTOR(S) : Abdalla Aly Naem et al.

It is certified that error appears in the above-identified patent and that said Letters Patent is hereby corrected as shown below:

Column 1, line 67, delete "region 1141 that" and replace with --region 114I that--.

Column 2, line 4, delete "region 1141 includes" and replace with --region 114I includes--.

Column 2, line 39, delete "1141 that exposes" and replace with --114I that exposes--.

Column 2, line 40, delete "region 1141 that" and replace with --region 114I that--.

Column 5, line 6, delete "region 1141, and" and replace with --region 114I, and--.

Column 6, line 37, delete "structure 1141 that" and replace with --structure 114I that--.

Column 6, line 42, delete "1141 and the" and replace with --114I and the--.

Column 8, line 66 - Column 9, line 1 (Claim 15, lines 16-17) delete "structure includes including a seed" and replace with --structure including a seed--.

Column 9, line 9 (Claim 15, line 25) delete "structure includes including a seed" and replace with --structure including a seed--.

Column 10, line 16 (Claim 17, line 25) delete "structure includes including a seed" and replace with --structure including a seed--.

This certificate supersedes the Certificate of Correction issued September 27, 2011.

Signed and Sealed this
Twenty-fifth Day of October, 2011

David J. Kappos
*Director of the United States Patent and Trademark Office*